(12) United States Patent
Rosa-Molinar

(10) Patent No.: US 12,224,154 B2
(45) Date of Patent: Feb. 11, 2025

(54) CONDUCTIVE FIXATION FOR ELECTRON MICROSCOPY

(71) Applicant: UNIVERSITY OF KANSAS, Lawrence, KS (US)

(72) Inventor: Eduardo Rosa-Molinar, Lawrence, KS (US)

(73) Assignee: University of Kansas, Lawrence, KS (US)

( * ) Notice: Subject to any disclaimer, the term of this patent is extended or adjusted under 35 U.S.C. 154(b) by 1051 days.

(21) Appl. No.: 16/961,328

(22) PCT Filed: Jan. 10, 2019

(86) PCT No.: PCT/US2019/013051
§ 371 (c)(1),
(2) Date: Jul. 10, 2020

(87) PCT Pub. No.: WO2019/140089
PCT Pub. Date: Jul. 18, 2019

(65) Prior Publication Data
US 2020/0373121 A1    Nov. 26, 2020

Related U.S. Application Data

(60) Provisional application No. 62/615,811, filed on Jan. 10, 2018, provisional application No. 62/615,866, filed on Jan. 10, 2018.

(51) Int. Cl.
*H01J 37/00* (2006.01)
*C08L 101/12* (2006.01)
(Continued)

(52) U.S. Cl.
CPC .......... *H01J 37/268* (2013.01); *C08L 101/12* (2013.01); *G01N 1/30* (2013.01); *G01N 1/42* (2013.01);
(Continued)

(58) Field of Classification Search
CPC .......... H01J 37/268; H01J 37/20; H01J 37/26; H01J 2237/2067; C08L 101/12;
(Continued)

(56) References Cited

U.S. PATENT DOCUMENTS 4,232,453 A    11/1980   Edelmann
5,525,522 A    6/1996    Klintworth et al.
(Continued)

FOREIGN PATENT DOCUMENTS

CN    102504485 A    11/2013
EP    1735376 B1     1/2017
(Continued)

OTHER PUBLICATIONS

Sosinsky, et al ("The combination of chemical fixation procedures with high pressure freezing and freeze substitution preserves highly labile tissue ultrastructure for electron tomography applications," J. Struct. Biol. Mar. 2008; 161(3):359-371 (Year: 2008).*

(Continued)

*Primary Examiner* — Michael Maskell
(74) *Attorney, Agent, or Firm* — Meunier Carlin & Curfman LLC

(57) ABSTRACT

Disclosed are compositions and methods for the conductive fixation of organic material, including biological samples. The compositions and methods described herein can address the problems of charging and sample damage caused by electron beam-sample interactions within an electron microscope.

20 Claims, 4 Drawing Sheets

(51) Int. Cl.
  *G01N 1/30*    (2006.01)
  *G01N 1/42*    (2006.01)
  *G01Q 30/02*   (2010.01)
  *H01J 37/26*   (2006.01)

(52) U.S. Cl.
  CPC ....... *G01Q 30/02* (2013.01); *G01N 2001/302* (2013.01); *G01N 2001/305* (2013.01)

(58) Field of Classification Search
  CPC ...... G01N 1/30; G01N 1/42; G01N 2001/302; G01N 2001/305; G01N 1/36; G01Q 30/02
  USPC .................... 250/306, 307, 310, 311, 440.11
  See application file for complete search history.

(56) References Cited

U.S. PATENT DOCUMENTS

| | | | |
|---|---|---|---|
| 9,557,253 B2 | 1/2017 | Hariyama et al. | |
| 2013/0084491 A1* | 4/2013 | Nakamoto | C07D 233/10 250/311 |

FOREIGN PATENT DOCUMENTS

| | | |
|---|---|---|
| JP | 2000028556 A | 1/2000 |
| JP | 2004347566 A | 12/2004 |
| JP | 5246348 B2 | 7/2013 |
| JP | 2013142624 A | 7/2013 |
| JP | 6055766 B2 | 12/2016 |
| JP | 2017166898 A | 9/2017 |
| WO | 2014199326 A1 | 12/2014 |
| WO | 2015009941 A1 | 1/2015 |

OTHER PUBLICATIONS

Kushida, ("Improved Methods for Embedding with Durucupan," J. Electron Microscopy, vol. 13, No. 3, pp. 139-144, 1964). (Year: 1964).*

International Search Report and Written Opinion mailed May 14, 2019 in PCT/US2019/013051 (12 pages).

Sosinsky et al., "The combination of chemical fixation procedures with high pressure freezing and freeze substitution preserves highly labile tissue ultrastructure for electron tomography applications," Journal of structural biology 161.3, Mar. 1, 2008, pp. 359-371.

Ludwig Edelman, "Adsorption staining of freeze substituted and low temperature embedded frog skeletal muscle with cesium: A new method for the investigation of protein-ion interactions," Scanning Microscopy Sup 5, Dec. 1, 1991, S75-S84.

Kent L. McDonald, "Out with the old and in with the new: rapid specimen preparation procedures for electron microscopy of sectioned biological material," Protoplasma 251.2, Mar. 1, 2014, pp. 429-448.

Ludwig Edelman, "Freeze-substitution and the preservation of diffusible ions," Journal of Microscopy 161.2, Sep. 25, 1991, pp. 217-288.

Extended European Search report issued for Application No. 19738704.6, dated Sep. 13, 2021.

English Translation of Notice of Reasons for Rejection received in Japanese Application No. 2020-538600, dated Dec. 26, 2022, 6 pages.

English Summary of Notice of Reasons for Rejection received in Japanese Application No. 2020-538600, dated Sep. 26, 2023, 3 pages.

First Office Action received in Chinese Application No. 201980016802.2, dated Mar. 9, 2023, 17 pages.

Second Office Action received in Chinese Application No. 201980016802.2, dated Nov. 8, 2023, 13 pages.

Intention to Grant received in European Application No. 19738704.6, dated Apr. 4, 2023, 8 pages.

Office Action received in Canadian Application No. 3,093,534, dated Nov. 8, 2023, 4 pages.

Decision to Grant received in Japanese Application No. 2020-538600, dated Mar. 12, 2024, 5 pages.

Notice of Allowance in Canadian Application No. 3,093,534, dated Mar. 15, 2024, 1 page.

English Translation of Decision of Rejection in Chinese Application No. 201980016802.2, dated Apr. 25, 2024, 21 pages.

Edelmann, L., "Selective Accumulation of Li+, Na+, K+, Rb+, and Cs+ at Protein Sites of Freeze-Dried Embedded Muscle Detected by LAMMA", "Fresenius Z. Anal. Chem.", vol. 208, pp. 218-220, Dec. 31, 1981.

* cited by examiner

ANALYSIS OF DATA USING THE UNIVERSAL POWER LAW FOR DISORDERED SOLIDS PROVIDED DIRECT CURRENT (DC) VALUES OBTAINED USING BROADBAND DIELECTRIC SPECTROSCOPY.

CONDUCTIVE FIXATION FOR ELECTRON MICROSCOPY

CROSS-REFERENCE TO RELATED APPLICATIONS

This application is a United States National Phase Patent Application of International Patent Application Number PCT/US2019/013051, filed on Jan. 10, 2019, which claims benefit of U.S. Provisional Application No. 62/615,811, filed Jan. 10, 2018, and U.S. Provisional Application No. 62/615,866, filed Jan. 10, 2018, each of which is hereby incorporated herein by reference in its entirety.

TECHNICAL FIELD

This application relates generally to methods and compositions for use in electron microscopy, particularly for reducing common problems associated with the imaging of biological samples.

BACKGROUND

Electron microscopy can be advantageously used to investigate the ultrastructure of biological samples such as cells and tissue, polymer resin samples, and crystalline samples such as inorganic substances. Two types of electron microscopes are known: scanning electron microscopes (hereinafter sometimes referred to as SEMs) and transmission electron microscopes (hereinafter sometimes referred to as TEMs).

In an electron microscope column, incident electrons are accelerated into, for example, epoxy resin-embedded samples (see FIG. 1). A number of interactions between the accelerated electrons and atoms contained within the resin-embedded sample result in elastic and inelastic scattering of electrons (known as the electron interaction volume; see FIG. 1). A number of signals generated (i.e., secondary electrons, backscattered electrons, cathodoluminescence, auger electrons, characteristic X-rays, and Bremsstrahlung X-rays) can be used for high-resolution electron microscopic imaging of ultrastructural features of cell and tissue organelles.

There are many complications associated with the imaging of non-conductive samples. As shown in FIG. 2, charging can complicate the imaging samples with low conductivity, such as biological samples. Charging is produced by build-up of electrons in a sample and their uncontrolled discharge. This can produce unwanted artifacts, particularly in secondary electron images. When the number of incident electrons is greater than the number of electrons escaping from the specimen then a negative charge builds up at the point where the beam hits the sample. This phenomenon is called charging and it causes a range of unusual effects such as abnormal contrast and image deformation and shift. Sometimes a sudden discharge of electrons from a charged area may cause a bright flash on the screen. These make it impossible to capture a uniform image of the specimen and may even be violent enough to cause small specimens to be dislodged from the mounting stub.

Irradiating a specimen with an electron beam can also result in a loss of the beam energy to the sample in the form of heat. A higher kV results in a higher temperature at the irradiated point and this can damage (e.g. melt) fragile specimens, such as polymers or proteins, and evaporate waxes or other sample components. This can ruin a sample (as well as contaminate the SEM chamber). The solution is to lower the beam energy, sometimes down to a few kV. Increasing the working distance can also help since it produces a larger spot size on the sample for the same beam energy but this has the disadvantage of reducing resolution To take advantage of high-resolution microscopies, the life sciences need better sample preparation workflows and reagents that will overcome charging and sample damage caused by electron beam-sample interactions in the electron microscope.

SUMMARY

Disclosed are methods of preparing a biological sample for microanalysis (e.g., imaging by electron microscopy). The methods can comprise (i) contacting the biological sample with a freeze substitution solution comprising a lithium salt under conditions effective to permit permeation of the lithium salt into the biological sample; (ii) contacting the biological sample with a first polymerizable resin under conditions effective to permit permeation of the polymerizable resin into the biological sample; (iii) disposing the biological sample in a volume of a second polymerizable resin; and (iv) heating the so-prepared biological sample to a temperature effective to cure the first polymerizable resin and the second polymerizable resin, thereby forming a 3-dimensional conductive sample block.

The lithium salt can exhibit a solubility in water of at least 10 g/100 mL at 20° C. The lithium salt can comprise, for example, lithium trifluoromethanesulfonate, lithium carbonate, lithium hydroxide, lithium chloride, lithium bromide, lithium citrate, lithium nitrate, lithium benzoate, lithium formate, or a combination thereof. In certain embodiments, the lithium salt can comprise lithium trifluoromethanesulfonate. The lithium salt can comprise from 0.1% to 10% by weight (e.g., from 0.5% to 4% by weight, or from 2% to 3% by weight) of the freeze substitution solution, based on the total weight of the freeze substitution solution.

In some embodiments, the method can further comprises contacting the biological sample with a fixation fluid prior to step (i). The fixation fluid can comprise an aldehyde (e.g., formaldehyde, paraformaldehyde, glutaraldehyde, or a combination thereof). In some embodiments, the fixation fluid can comprise an aqueous solution comprising from 2% to 8% by weight aldehyde, based on the total weight of the fixation fluid. In certain embodiments, the fixation fluid comprises an aqueous solution comprising from 1% to 3% by weight glutaraldehyde and from 1% to 3% by weight paraformaldehyde. The aqueous solution can comprise a physiological buffer, such as Hanks' Balanced Salt Solution.

In some embodiments, the freeze substitution solution can further comprise an oxidizing fixative, such as osmium tetroxide. The oxidizing fixative can comprise from 0.5% to 5% by weight of the freeze substitution solution, such as from 2% to 3% by weight of the freeze substitution solution.

In some embodiments, the freeze substitution solution can further comprise a negative stain, such as a uranium salt, a lead salt, or a combination thereof. The negative stain can comprise from 0.5% to 8% by weight of the freeze substitution solution, such as from 2% to 6% by weight of the freeze substitution solution. In some cases, the freeze substitution solution can further comprise a uranium salt, such as uranyl acetate. In some cases, the freeze substitution solution can further comprise a lead salt, such as lead citrate. In certain embodiments, the freeze substitution solution can comprise from 3% to 5% by weight uranyl acetate and from 0.1% to 1% by weight lead citrate, based on the total weight of the freeze substitution solution.

In some embodiments, the freeze substitution solution can further comprise a mordant, such as tannic acid. The mordant can comprise from 0.01% to 1% by weight of the freeze substitution solution, based on the total weight of the freeze substitution solution.

In some embodiments, the freeze substitution solution can further comprise p-phenylenediamine, such as from 0.1% to 2% by weight p-phenylenediamine, based on the total weight of the freeze substitution solution.

In some embodiments, the freeze substitution solution can further comprise a lanthanum salt (e.g., lanthanum nitrate), such as from 0.5% to 6% by weight lanthanum salt (e.g., lanthanum nitrate), based on the total weight of the freeze substitution solution.

In some embodiments, contacting step (i) can comprise immersing the biological sample in the freeze substitution solution at a first temperature below 0° C. for a first duration; and immersing the sample in the freeze substitution solution at a second temperature above 0° C. for a second duration. The first temperature can be from −70° C. to −80° C., such as about −78° C. The first duration can be from 8 hours to 24 hours. The second temperature can be from 0° C. to 10° C. The second duration can be from 8 hours to 24 hours.

In some embodiments, contacting step (i) can further comprise immersing the biological sample in the freeze substitution solution at a third temperature below 0° C. for a third duration before immersing the sample in the freeze substitution solution at the second temperature above 0° C. for the second duration. The third temperature can be from −10° C. to −40° C., such as about −20° C. The third duration can be from 2 hours to 12 hours.

In some embodiments, contacting step (i) further comprising immersing the biological sample in the freeze substitution solution at a fourth temperature above 0° C. for a fourth duration. The fourth temperature can be from 15° C. to 30° C., such as about 23° C. The fourth duration can be from 2 hours to 12 hours.

The first polymerizable resin can comprises an epoxy resin (e.g., a water-soluble epoxy resin), such as a bisphenol A-epichlorhydrin epoxy resin.

The second polymerizable resin can comprises an epoxy resin (e.g., a water-soluble epoxy resin), such as a bisphenol A-epichlorhydrin epoxy resin. In some embodiments, the second polymerizable resin can further comprise an accelerator, such as 2,4,6-Tris(dimethylaminomethyl)phenol (DMP-30), benzyl dimethylamine (BDMA), or a combination thereof.

Step (iv) can comprise heating the so-prepared biological sample to a temperature of at least 40° C., such as from 45° C. to 80° C., or from 55° C. to 75° C.

Also provided are methods for imaging biological samples, such as cells and tissues. The methods can comprise preparing the biological sample for microanalysis using a method described herein, thereby forming a 3-dimensional conductive sample block; physically sectioning the 3-dimensional conductive sample block to obtain one or more sample sections; and imaging the one or more sample sections via electron microscopy. Physically sectioning the 3-dimensional conductive sample block can comprise, for example, microtoming the 3-dimensional conductive sample block. The electron microscopy can comprise scanning electron microscopy or transmission electron microscopy.

Further provided are methods for serial block-face scanning electron microscopy (SBEM). These methods can comprise preparing the biological sample for microanalysis using a method described herein, thereby forming a 3-dimensional conductive sample block; placing the 3-dimensional conductive sample block in an SEM microscope; and successively imaging different depths in the 3-dimensional conductive sample block.

In some embodiments, successively imaging different depths can comprise virtually imaging different depths by focusing a different level. In other embodiments, successively imaging different depths can comprise physically sectioning the 3-dimensional conductive sample block. In certain embodiments, physically sectioning the 3-dimensional conductive sample block can comprise automated sectioning with a diamond knife in an SBEM chamber.

Also provided are freeze substitution solutions for use in preparing biological samples for microanalysis. The freeze substitution solutions can comprise from 0.1% to 10% by weight of a lithium salt, based on the total weight of the freeze substitution solution; from 0.5% to 5% by weight osmium tetroxide, based on the total weight of the freeze substitution solution; from 0.5% to 8% by weight one or more negative stains, based on the total weight of the freeze substitution solution, wherein the one or more negative stains are chosen from a uranium salt, a lead salt, or a combination thereof and from 60% to 98.9% acetone. In certain embodiments, the freeze substitution solution can be substantially anhydrous (e.g., the freeze substitution can contain less than 1% by weight, less than 0.5% by weight, less than 0.25% by weight, less than 0.1% by weight, less than 0.05% by weight, less than 0.025% by weight, or less than 0.01% by weight water, based on the total weight of the freeze substitution solution).

The lithium salt can exhibit a solubility in water of at least 10 g/100 mL at 20° C. The lithium salt can comprise, for example, lithium trifluoromethanesulfonate, lithium carbonate, lithium hydroxide, lithium chloride, lithium bromide, lithium citrate, lithium nitrate, lithium benzoate, lithium formate, or a combination thereof. In certain embodiments, the lithium salt can comprise lithium trifluoromethanesulfonate. In some embodiments, the lithium salt can comprise from 0.5% to 4% by weight, or from 2% to 3% by weight of the freeze substitution solution, based on the total weight of the freeze substitution solution.

In some embodiments, the osmium tetroxide can comprise from 2% to 3% by weight of the freeze substitution solution.

In some embodiments, the one or more negative stains comprise a uranium salt, such as uranyl acetate. In some embodiments, the one or more negative stains comprise a lead salt, such as lead citrate. In some embodiments, the negative stain can comprise from 2% to 6% by weight of the freeze substitution solution. In certain embodiments, the freeze substitution solution can comprise from 3% to 5% by weight uranyl acetate and from 0.1% to 1% by weight lead citrate, based on the total weight of the freeze substitution solution.

In some cases, the freeze substitution solution can further comprise a mordant, such as tannic acid. The mordant can comprise from 0.01% to 1% by weight of the freeze substitution solution, based on the total weight of the freeze substitution solution.

In some cases, the freeze substitution solution can further comprise p-phenylenediamine, such as from 0.1% to 2% by weight p-phenylenediamine, based on the total weight of the freeze substitution solution.

In some embodiments, the freeze substitution solution can further comprise a lanthanum salt (e.g., lanthanum nitrate), such as from 0.5% to 6% by weight lanthanum salt (e.g., lanthanum nitrate), based on the total weight of the freeze substitution solution.

DESCRIPTION OF DRAWINGS

FIG. 6A shows image data collected using a sample prepared using 3% dried lithium trifluoromethanesulfonate in the filtered fixative/conductive freeze substitution solution, whereas FIG. 6B shows image data collected using a sample prepared without the filtered fixative/conductive freeze substitution solution. The inclusion of the lithium salt in the filtered fixative/conductive freeze substitution solution produces perfectly aligned image data that results in smooth realistic 3-D reconstructions (as shown in 6A) as compared to the significantly more disjointed reconstruction shown in FIG. 6B. The jagged surface appearance in FIG. 6B is the result of instability.

DETAILED DESCRIPTION

Figure 1:
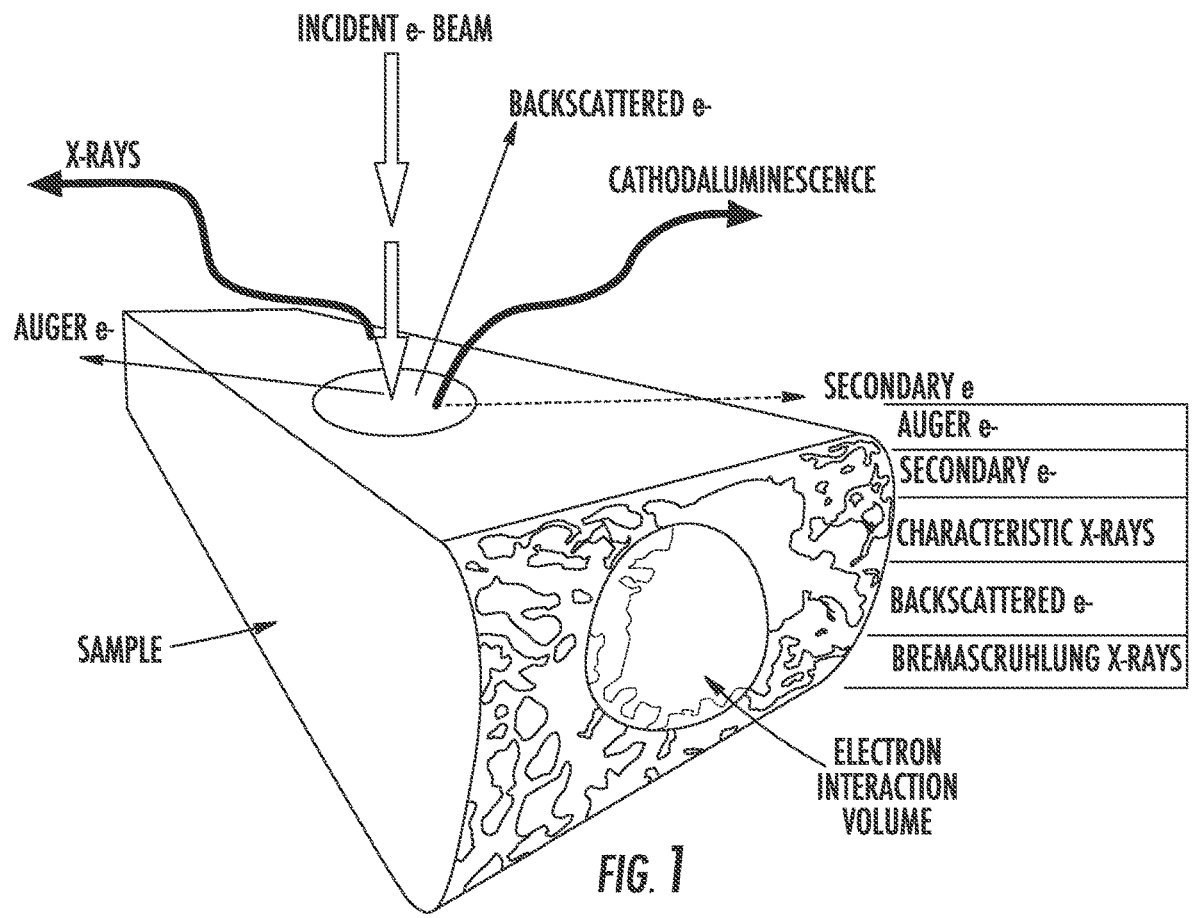
FIG. 1 is a schematic illustration showing electron interaction volume within an epoxy resin embedded sample.
Figure 2:
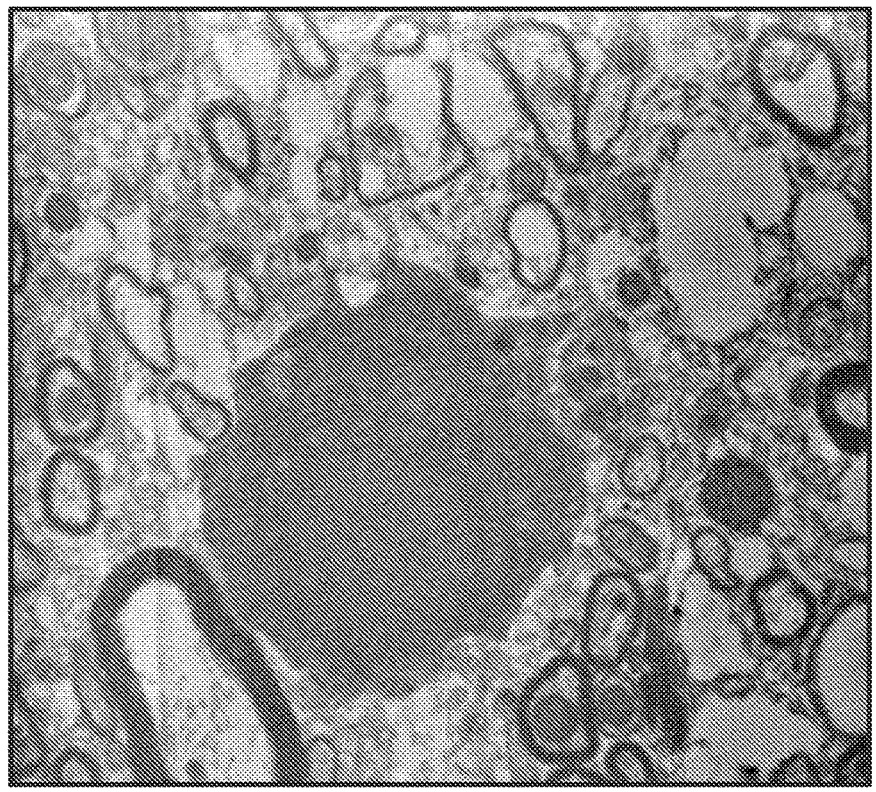
FIG. 2 is an SEM micrograph that includes charging artifacts. Charging (visible as dark lines running vertically in the micrograph) is caused by the buildup of negative charge in a sample irradiated with an electron beam. Charging generally occurs when the sample being imaged has poor electrical conductivity.

Described herein are compositions and methods for the conductive fixation of organic material, including biological samples (e.g., tissue samples and cells). As discussed below, these compositions and methods can address the problems of charging and sample damage caused by electron beam-sample interactions within an electron microscope.

For example, disclosed are methods of preparing a biological sample for microanalysis (e.g., imaging by electron microscopy). The methods can comprise (i) contacting the biological sample with a freeze substitution solution comprising a lithium salt under conditions effective to permit permeation of the lithium salt into the biological sample; (ii) contacting the biological sample with a first polymerizable resin under conditions effective to permit permeation of the polymerizable resin into the biological sample; (iii) disposing the biological sample in a volume of a second polymerizable resin; and (iv) heating the so-prepared biological sample to a temperature effective to cure the first polymerizable resin and the second polymerizable resin, thereby forming a 3-dimensional conductive sample block.

The lithium salt can exhibit a solubility in water of at least 10 g/100 mL at 20° C. (e.g., a solubility in water of at least 50 g/100 mL at 20° C., or a solubility in water of at least 100 g/100 mL at 20° C.). The lithium salt can comprise any suitable lithium salt which is suitably soluble in both acetone and water. Examples of suitable lithium salts include, for example, lithium trifluoromethanesulfonate, lithium carbonate, lithium hydroxide, lithium chloride, lithium bromide, lithium citrate, lithium nitrate, lithium benzoate, lithium formate, and combinations thereof. In certain embodiments, the lithium salt can comprise lithium trifluoromethanesulfonate (also referred to as lithium triflate).

In some embodiments, the freeze substitution solution can comprise at least 0.1% by weight (e.g., 0.5% by weight, at least 1% by weight, at least 1.5% by weight, at least 2% by weight, at least 2.5% by weight, at least 3% by weight, at least 3.5% by weight, at least 4% by weight, at least 4.5% by weight, at least 5% by weight, at least 5.5% by weight, at least 6% by weight, at least 6.5% by weight, at least 7% by weight, at least 7.5% by weight, at least 8% by weight, at least 8.5% by weight, at least 9% by weight, or at least 9.5% by weight) of the lithium salt, based on the total weight of the freeze substitution solution. In some embodiments, the freeze substitution solution can comprise 10% by weight or less (e.g., 9.5% by weight or less, 9% by weight or less, 8.5% by weight or less, 8% by weight or less, 7.5% by weight or less, 7% by weight or less, 6.5% by weight or less, 6% by weight or less, 5.5% by weight or less, 5% by weight or less, 4.5% by weight or less, 4% by weight or less, 3.5% by weight or less, 3% by weight or less, 2.5% by weight or less, 2% by weight or less, 1.5% by weight or less, 1% by weight or less, or 0.5% by weight or less) of the lithium salt, based on the total weight of the freeze substitution solution.

The lithium salt can be present in the freeze substitution solution in an amount ranging from any of the minimum values described above to any of the maximum values described above. For example, in some embodiments, the lithium salt can comprise from 0.1% to 10% by weight (e.g., from 0.5% to 4% by weight, or from 2% to 3% by weight) of the freeze substitution solution, based on the total weight of the freeze substitution solution.

The biological sample can be any type of biological sample. Biological samples may be of prokaryotic origin or eukaryotic origin. For example, the biological sample may be originated from a biological subject such as a bacterium, a fungus, a protozoan, an insect, a fish, a bird, a reptile, a mammal (e.g., mouse, rat, cow, dog, donkey, guinea pig, or rabbit), or a primate (e.g., chimpanzee, or human). Biological sample may be obtained or derived from a biological subject by a variety of methods. For example, a biological sample may include tissues or cells isolated from mammals (e.g., humans), or sections of a biological sample (e.g., sectional portion of an organ or tissue). In some examples, the biological sample can comprise neural cells, embryonic cells, blood cells, skin cells, cardiac cells, liver cells, bone cells, endothelial cells, or pancreatic cells. Other non-limiting examples of biological samples include skin, heart tissue, lung tissue, kidney tissue, bone marrow, bone, breast tissue, pancreas tissue, liver tissue, muscle tissue, smooth muscle tissue, bladder tissue, gall bladder tissue, colon tissue, intestinal tissue, brain tissue, prostate tissue, esophagus tissue, thyroid tissue, spinal cord, and teeth. In one example, the biological sample can comprise a solid tumor. In another example, the biological sample can comprise an interface between a biomaterial and a tissue (e.g., a portion of a medical implant or device and tissue contacting the implant or device).

In some embodiments, the method can further comprises contacting the biological sample with a fixation fluid prior to step (i). The fixation fluid can comprise an aldehyde (e.g., formaldehyde, paraformaldehyde, glutaraldehyde, or a combination thereof). In some embodiments, the fixation fluid can comprise an aqueous solution comprising from 2% to 8% by weight aldehyde (e.g., from 2% to 6% by weight aldehyde), based on the total weight of the fixation fluid.

In some embodiments, the fixation can comprise a mixture of two or more aldehydes (e.g., a mixture of glutaraldehyde and paraformaldehyde). In certain embodiments, the fixation fluid comprises an aqueous solution comprising from 1% to 3% by weight glutaraldehyde and from 1% to 3% by weight paraformaldehyde.

The aqueous solution can comprise a physiological buffer. The phrase "physiological buffer" refers to a buffered solution at physiological conditions. Examples of physiological buffers include, but are not limited to, phosphate-buffered saline (PBS), Hanks' Balanced Salt Solution (HBBS), Ringer's solution, and Dulbecco's modified Eagle's medium (DMEM).

In some embodiments, the freeze substitution solution can further comprise an oxidizing fixative, such as osmium tetroxide. The oxidizing fixative can comprise from 0.5% to 5% by weight of the freeze substitution solution, such as from 2% to 3% by weight of the freeze substitution solution.

In some embodiments, the freeze substitution solution can further comprise a negative stain, such as a uranium salt, a lead salt, or a combination thereof. The negative stain can comprise from 0.5% to 8% by weight of the freeze substitution solution, such as from 2% to 6% by weight of the freeze substitution solution. In some cases, the freeze substitution solution can further comprise a uranium salt, such as uranyl acetate. In some cases, the freeze substitution solution can further comprise a lead salt, such as lead citrate. In certain embodiments, the freeze substitution solution can comprise from 3% to 5% by weight uranyl acetate and from 0.1% to 1% by weight lead citrate, based on the total weight of the freeze substitution solution.

In some embodiments, the freeze substitution solution can further comprise a mordant, such as tannic acid. The mordant can comprise from 0.01% to 1% by weight of the freeze substitution solution, based on the total weight of the freeze substitution solution.

In some embodiments, the freeze substitution solution can further comprise p-phenylenediamine, such as from 0.1% to 2% by weight p-phenylenediamine, based on the total weight of the freeze substitution solution.

In some embodiments, the freeze substitution solution can further comprise a lanthanum salt (e.g., lanthanum nitrate), such as from 0.5% to 6% by weight lanthanum salt (e.g., lanthanum nitrate), based on the total weight of the freeze substitution solution.

In some embodiments, contacting step (i) can comprise immersing the biological sample in the freeze substitution solution at a first temperature below 0° C. for a first duration; and immersing the sample in the freeze substitution solution at a second temperature above 0° C. for a second duration. The first temperature can be from −70° C. to −80° C., such as about −78° C. The first duration can be from 8 hours to 24 hours. The second temperature can be from 0° C. to 10° C. The second duration can be from 8 hours to 24 hours.

In some embodiments, contacting step (i) can further comprise immersing the biological sample in the freeze substitution solution at a third temperature below 0° C. for a third duration before immersing the sample in the freeze substitution solution at the second temperature above 0° C. for the second duration. The third temperature can be from −10° C. to −40° C., such as about −20° C. The third duration can be from 2 hours to 12 hours.

In some embodiments, contacting step (i) further comprising immersing the biological sample in the freeze substitution solution at a fourth temperature above 0° C. for a fourth duration. The fourth temperature can be from 15° C. to 30° C., such as about 23° C. The fourth duration can be from 2 hours to 12 hours.

The first polymerizable resin and the second polymerizable can each independently be any resin known for use in embedding samples (e.g., biological samples such as cells and tissue) for analysis by electron microscopy. In some cases, first polymerizable resin and the second polymerizable can each independently comprises an epoxy resin (e.g., a water-soluble epoxy resin).

The term "epoxy resin" is meant to include any material or compound having one or more oxirane rings that are capable of undergoing polymerization. As such, this term encompasses epoxy-containing monomers, epoxy-containing oligomers, and epoxy-containing crosslinking agents. The singular form of the term is intended to include the plural form of the term. Oligomeric and multifunctional epoxy materials can also be used as epoxy resins.

Epoxy resins can comprise organic compounds having at least one oxirane ring, which oxirane ring is shown in the following formula:

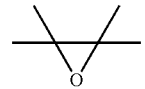

that is polymerizable by a ring opening mechanism. Such epoxy resins, also called "epoxides", include monomeric epoxy compounds and epoxides of the polymeric type and can be aliphatic, cycloaliphatic, aromatic or heterocyclic. These materials generally have, on the average, at least one polymerizable epoxy group per molecule, or typically at least about 1.5 and even at least about 2 polymerizable epoxy groups per molecule. Polymeric polymerizable epoxy materials include linear polymers having terminal epoxy groups (for example, a diglycidyl ether of a polyoxyalkylene glycol), polymers having skeletal (backbone) oxirane units (for example, a polybutadiene polyepoxide), and polymers having pendant epoxy groups (for example, a glycidyl methacrylate polymer or copolymer).

The epoxy resins can be single compounds or they can be mixtures of different epoxy materials containing one, two, or more epoxy groups per molecule. The "average" number of epoxy groups per molecule is determined by dividing the total number of epoxy groups in the epoxy material by the total number of epoxy-containing molecules present.

The epoxy resins can vary from low molecular weight monomeric materials to high molecular weight polymers and they can vary greatly in the nature of the backbone and substituent (or pendant) groups. For example, the backbone can be of any type and substituent groups thereon can be any group that does not substantially interfere with cationic photocuring process desired at room temperature and do not negatively impact subsequent imaging by electron microscopy. Illustrative of substituent groups include but are not limited to, halogens, ester groups, ethers, sulfonate groups, siloxane groups, nitro groups, and phosphate groups. The molecular weight of the epoxy materials can be at least 58 and up to and including 100,000, or even higher.

Useful epoxy resins include those that contain cyclohexene oxide groups such as epoxycyclohexane carboxylates, such as 3,4-epoxycyclohexylmethyl-3,4-epoxycyclohexane carboxylate, 3,4-epoxy-2-methylcyclohexylmethyl-3,4-epoxy-2-methylcyclohexane carboxylate, and bis(3,4-epoxy-6-methylcyclohexylmethyl) adipate. Still other useful epoxy resins include glycidyl ether monomers that are glycidyl ethers of polyhydric phenols obtained by reacting a polyhydric phenol with an excess of chlorohydrin such as epichlorohydrin [for example, the diglycidyl ether of 2,2-bis-(2,3-epoxypropoxyphenol)-propane].

Many commercially available epoxy resin are known, including glycidyl ethers such as bisphenol-A-diglycidyl ether (DGEBA), glycidyl ethers of bisphenol S and bisphenol F, butanediol diglycidyl ether, bisphenol-A-extended glycidyl ethers, phenol-formaldehyde glycidyl ethers (epoxynovolacs) and cresol-formaldehyde glycidyl ethers (epoxy cresol novolacs), epoxidized alkenes such as 1,2-epoxyoctane, 1,2,13,14-tetradecane diepoxide, 1,2,7,8-octane diepoxide, octadecylene oxide, epichlorohydrin, styrene oxide, vinyl cyclohexene oxicyclohexene oxide, glycidol, glycidyl methacrylate, diglycidyl ether of Bisphenol A (for example, those available under the EPON trademark such as Epon™ 812, from Shell Chemical Co., Epon™ 828, Epon™ 825, Epon™ 1004, and Epon™ 1010 from Momentive, EMbed™ 812 from Electron Microscopy Services, Eponate 12™ from PELCO, DER-331, DER-332, and DER-334 resins from Dow Chemical Co.), vinyl cyclohexene dioxide (for example, ERL-4206 resin from Polyscience), 3,4-epoxycyclohexylmethyl-3,4-epoxycyclohexene carboxylate (for example, ERL-4221, CYRACURE™ 6110, or CYRACURE™ 6105 monomers from Dow Chemical Corp.), 3,4-epoxy-6-methylcyclohexyl-methyl-3,4-epoxy-6-methyl-cyclohexene carboxylate (for example, from Pfaltz and Bauer), bis(3,4-epoxy-6-methylcyclohexylmethyl) adipate, bis(2,3-epoxy-cyclopentyl) ether, aliphatic epoxy modified with polypropylene glycol, dipentene dioxide, epoxidized polybutadiene (for example, Oxiron 2001 resin from FMC Corp.), silicone resin containing epoxy functionality, flame retardant epoxy resins (for example, DER-580 resin, a brominated bisphenol type epoxy resin available from Dow Chemical Co.), 1,4-butanediol diglycidyl ether of phenol formaldehyde novolak (for example, DEN-431 and DEN-438 resins from Dow Chemical Co.), resorcinol diglycidyl ether, bis(3,4-epoxycyclohexyl) adipate (for example, CYRACURE™ resin from Dow Corning Corp.), 2-(3,4-epoxycyclohexyl-5,5-spiro-3,4-epoxy)cyclohexane-metadioxane, vinyl cyclohexene monoxide, 1,2-epoxyhexadecane (for example, CYRACURE™ resin from Dow Corning Corp.), alkyl glycidyl ethers such as HELOXY™ Modifier 7 and HELOXY™ Modifier 8 (from Momentive), butyl glycidyl ether (for example, HELOXY™ Modifier 61 from Momentive), cresyl glycidyl ether (for example, HELOXY™ Modifier 62 from Momentive), p-tert butylphenyl glycidyl ether (for example, HELOXY™ Modifier 65 from Momentive), polyfunctional glycidyl ethers such as diglycidyl ether of 1,4-butanediol (for example, HELOXY™ Modifier 67 from Momentive), diglycidyl ether of neopentyl glycol (for example, HELOXY™ Modifier 68 from Momentive), diglycidyl ether of cyclohexanedimethanol (for example, HELOXY™ Modifier 107 from Momentive), trimethylol ethane triglycidyl ether (for example, HELOXY™ Modifier 44 from Momentive), trimethylol propane triglycidyl ether (for example, HELOXY™ Modifier 48 from Momentive), polyglycidyl ether of an aliphatic polyol (for example, HELOXY™ Modifier 84 from Momentive), polyglycol diepoxide (for example, HELOXY™ Modifier 32 from Momentive), bisphenol F epoxides (for example, EPN-1138 or GY-281 resin from Huntman Advanced Materials), and 9,9-bis>4-(2,3-epoxypropoxy)-phenyl fluorenone (for example, Epon™ 1079 resin from Momentive).

Still other epoxy resins are known, such as copolymers derived from acrylic acid esters reacted with glycidol such as glycidyl acrylate and glycidyl methacrylate, copolymerized with one or more ethylenically unsaturated polymerizable monomers. Examples of such copolymers are poly (styrene-co-glycidyl methacrylate) (50:50 molar ratio), poly (methyl methacrylate-co-glycidyl acrylate) (50:50 molar ratio), and poly(methyl methacrylate-co-ethyl acrylate-co-glycidyl methacrylate) (62.5:24:13.5 molar ratio). Other epoxy resins include epichlorohydrin such as epichlorohydrin, alkylene oxides such as propylene oxide and styrene oxide, alkenyl oxides such as butadiene oxide, and glycidyl esters such as ethyl glycidate. Other epoxy materials include silicones having an epoxy functionality or group such as cyclohexylepoxy groups, especially those epoxy materials having a silicone backbone. Commercial examples of such epoxy resins include UV 9300, UV 9315, UV 9400, UV 9425 silicone materials that are available from Momentive.

Polymeric epoxy resins can optionally contain other functionalities that do not substantially interfere with cationic photocuring of the photopolymerizable composition at room temperature and do not adversely impact imaging by electron microscopy. For example, the epoxy materials can also include free-radically polymerizable functionality, as described in more detail below. For example, the epoxy material can also contain free-radically polymerizable functionality in the same molecule. Thus, such epoxy materials can include one or more epoxy groups as well as one or more ethylenically unsaturated polymerizable bonds. For example, multi-polymerizable functioning materials can be obtained by reacting a di- or poly-epoxide with one or more equivalents of an ethylenically unsaturated carboxylic acid. Examples of such reaction products include the reaction product of VR-6105 or DER 332 (available from Dow Chemical Co.) with one equivalent of methacrylic acid. Commercially available materials having both one or more epoxy groups and free-radically polymerizable functionalities include the Cyclomer compounds, such as Cyclomer M100 or M101 (available from Daicel Chemical, Japan).

The epoxy resin can comprise a blend or mixture of two or more different epoxy materials. Examples of such blends include two or more molecular weight distributions of epoxy materials, such as a blend of one or more low molecular weight (below 200) epoxy materials with one or more intermediate molecular weight (from 200 to 10,000) epoxy materials, or one or more of such epoxy materials with one or more higher molecular weight (above 10,000) epoxy materials. Alternatively or additionally, the epoxy resin can comprise a blend of epoxy materials having different chemical natures, such as aliphatic and aromatic natures, or different functionalities, such as polar and non-polar properties. Other cationically polymerizable monomers or polymers can additionally be incorporated into the epoxy resin.

In some embodiment, the first polymerizable resin can comprises an epoxy resin (e.g., a water-soluble epoxy resin), such as a bisphenol A-epichlorhydrin epoxy resin.

In some embodiments, the second polymerizable resin can comprises an epoxy resin (e.g., a water-soluble epoxy resin), such as a bisphenol A-epichlorhydrin epoxy resin.

In certain embodiments, the first polymerizable resin, the second polymerizable, or a combination thereof can comprise a bisphenol-A-epichlorhydrin epoxy resin (e.g., having a number average molecular weight≤700).

In some embodiments, the second polymerizable resin can further comprise an accelerator, such as 2,4,6-Tris (dimethylaminomethyl)phenol (DMP-30), benzyl dimethylamine (BDMA), or a combination thereof.

Step (iv) can comprise heating the so-prepared biological sample to a temperature of at least 40° C., such as from 45° C. to 80° C., or from 55° C. to 75° C.

Also provided are methods for imaging biological samples, such as cells and tissues. The methods can comprise preparing the biological sample for microanalysis using a method described herein, thereby forming a 3-dimensional conductive sample block; physically sectioning the 3-dimensional conductive sample block to obtain one or more sample sections; and imaging the one or more sample sections via electron microscopy. Physically sectioning the 3-dimensional conductive sample block can comprise, for example, microtoming the 3-dimensional conductive sample block. The electron microscopy can comprise scanning electron microscopy or transmission electron microscopy. In certain embodiments, the electron microscopy can comprise serial sectioning scanning electron microscopy (SSSEM) or serial scanning transmission electron microscopy (SSTEM).

Further provided are methods for serial block-face scanning electron microscopy (SBEM). SBEM is a recent microscopy technique that shows great promise for histology and neuroanatomical research by allowing the 3-dimensional reconstruction of relatively large regions of tissue in a "block" form and cell arrays at near nanometer-scale resolution. SBEM employs an automated ultramicrotome fitted into a scanning electron microscope to image a tissue block-face. Samples are prepared by methods similar to those in transmission electron microscopy, typically by staining the specimen then embedding in an epoxy resin. The resin commonly used to immobilize, protect and establish volume uniformity is an insulating material. In SBEM, successive slices are removed from the targeted tissue or the tissue position is changed to change the focus depth in the block and an electron beam is scanned over the remaining block-face or at the new focus depth to produce electron backscatter images. SBEM is useful, for example, to study the 3D ultrastructure of astrocytes, neurons and synapses.

An SBEM instrument includes an ultra-microtome fitted within a backscatter-detector equipped SEM. In an automated process, the ultra-microtome removes an ultra-thin section of tissue with an oscillating diamond knife and the region of interest is imaged. This sequence is repeated hundreds or thousands of times until the desired volume of tissue is traversed. This method potentially enables the reconstruction of microns to tenths of millimeters of volumes of tissue at a level of resolution better than that obtainable by light microscopy. In other variations, the tissue is raised to change the focus of the beam, obtaining a virtual slice of the tissue sample.

Methods for SBEM can comprise preparing the biological sample for microanalysis using a method described herein, thereby forming a 3-dimensional conductive sample block; placing the 3-dimensional conductive sample block in an SEM microscope; and successively imaging different depths in the 3-dimensional conductive sample block.

In some embodiments, successively imaging different depths can comprise virtually imaging different depths by focusing a different level. In other embodiments, successively imaging different depths can comprise physically sectioning the 3-dimensional conductive sample block. In certain embodiments, physically sectioning the 3-dimensional conductive sample block can comprise automated sectioning with a diamond knife in an SBEM chamber.

Also provided are freeze substitution solutions for use in preparing biological samples for microanalysis. The freeze substitution solutions can comprise from 0.1% to 10% by weight of a lithium salt, based on the total weight of the freeze substitution solution; from 0.5% to 5% by weight osmium tetroxide, based on the total weight of the freeze substitution solution; from 0.5% to 8% by weight one or more negative stains, based on the total weight of the freeze substitution solution, wherein the one or more negative stains are chosen from a uranium salt, a lead salt, or a combination thereof and from 60% to 98.9% acetone. In certain embodiments, the freeze substitution solution can be substantially anhydrous (e.g., the freeze substitution can contain less than 1% by weight, less than 0.5% by weight, less than 0.25% by weight, less than 0.1% by weight, less than 0.05% by weight, less than 0.025% by weight, or less than 0.01% by weight water, based on the total weight of the freeze substitution solution).

The lithium salt can exhibit a solubility in water of at least 10 g/100 mL at 20° C. The lithium salt can comprise, for example, lithium trifluoromethanesulfonate, lithium carbonate, lithium hydroxide, lithium chloride, lithium bromide, lithium citrate, lithium nitrate, lithium benzoate, lithium formate, or a combination thereof. In certain embodiments, the lithium salt can comprise lithium trifluoromethanesulfonate. In some embodiments, the lithium salt can comprise from 0.5% to 4% by weight, or from 2% to 3% by weight of the freeze substitution solution, based on the total weight of the freeze substitution solution.

In some embodiments, the osmium tetroxide can comprise from 2% to 3% by weight of the freeze substitution solution.

In some embodiments, the one or more negative stains comprise a uranium salt, such as uranyl acetate. In some embodiments, the one or more negative stains comprise a lead salt, such as lead citrate. In some embodiments, the negative stain can comprise from 2% to 6% by weight of the freeze substitution solution. In certain embodiments, the freeze substitution solution can comprise from 3% to 5% by weight uranyl acetate and from 0.1% to 1% by weight lead citrate, based on the total weight of the freeze substitution solution.

In some cases, the freeze substitution solution can further comprise a mordant, such as tannic acid. The mordant can comprise from 0.01% to 1% by weight of the freeze substitution solution, based on the total weight of the freeze substitution solution.

In some cases, the freeze substitution solution can further comprise p-phenylenediamine, such as from 0.1% to 2% by weight p-phenylenediamine, based on the total weight of the freeze substitution solution.

In some embodiments, the freeze substitution solution can further comprise a lanthanum salt (e.g., lanthanum nitrate), such as from 0.5% to 6% by weight lanthanum salt (e.g., lanthanum nitrate), based on the total weight of the freeze substitution solution.

By way of non-limiting illustration, examples of certain embodiments of the present disclosure are given below.

EXAMPLES

Example 1

Conductive Fixation of Organic Material

This example explores compositions and methods for the conductive fixation of organic material, including biological samples. As discussed below, these compositions and methods can address the problems of charging and sample damage caused by electron beam-sample interactions within an electron microscope.

Materials and Methods

An animal was anesthetized and then perfused transcardially with Hanks' Balanced Salt Solution (HBSS) followed by 4% paraformaldehyde (v/v; PFA) diluted with HBSS from an 8% PFA aqueous stock solution. The animal's spinal cord was exposed. The animal was then post-fixed with 4% PFA for 1-hour on ice. The spinal cord was removed and immersed in a modified Karnovsky fixative (2.5% glutaraldehyde and 2% PFA diluted in HBSS) for 1-hour on ice. The spinal cord was then immersed in a filtered fixative/conductive freeze-substitution solution containing 2% osmium tetroxide, 4% uranyl acetate, 0.4% lead citrate, 0.1% tannic acid, 1% p-phenylenediamine, 3% dried lanthanum nitrate (dried lanthanum nitrate provides differential en-bloc staining of tight and gap junctions), 3% dried lithium trifluoromethanesulfonate diluted in absolute dried acetone. The sample was then incubated in this solution in a cooler with dry ice (−78.5° C.) overnight.

The sample was removed from the cooler the next morning, and incubated at −20° C. for 4 hours. The filtered fixative/conductive freeze-substitution solution was then exchanged with a fresh filtered fixative/conductive freeze-substitution solution, and spinal cord was incubated at 4° C. overnight. The filtered fixative/conductive freeze-substitution solution was then exchanged with a fresh filtered fixative/conductive freeze-substitution solution one more time, and the spinal cord incubated at room temperature (RT) inside a fume hood for 4 hours.

Following incubation, the spinal cord was rinsed with absolute dried acetone twice (5 minutes each rinse, room temperature). The spinal cord was then rinsed in absolute dried acetone four times (10 minutes each rinse, room temperature).

Following sequential acetone rinses, the spinal cord was immersed in a mixture of Embed 812 resin and absolute dried acetone for 10 minutes at RT. Next, the spinal cord was immersed in 100% Embed 812 resin for 10 minutes at RT. The Embed 812 resin was then exchanged twice, with the sample being incubated for 10 minutes at RT per each exchange. The sample spinal cord was then incubated for 24 hours at RT to allow the Embed 812 resin to permeate into the spinal cord.

The spinal cord was transferred into a flat embedding mold filled with Embed 812 resin with DMP-30. The mold was then placed inside a cocoon box and moved into oven at 60° C. for 36-48 hours to polymerize the resin.

Following the polymerization of the Embed 812 resin, Embed 812 resin blocks containing the spinal cord tissue were faced and serially thick (120 nm-1 um) or thin (20 nm-50 nm) sectioned/imaged using standard ultramicrotome/transmission or scanning electron microscope (variable pressure, filed-emission), ATUMtome/scanning electron microscope, Gatan3View/scanning electron microscope, or focused ion beam scanning electron microscope.

Results and Discussion

Figure 3A:
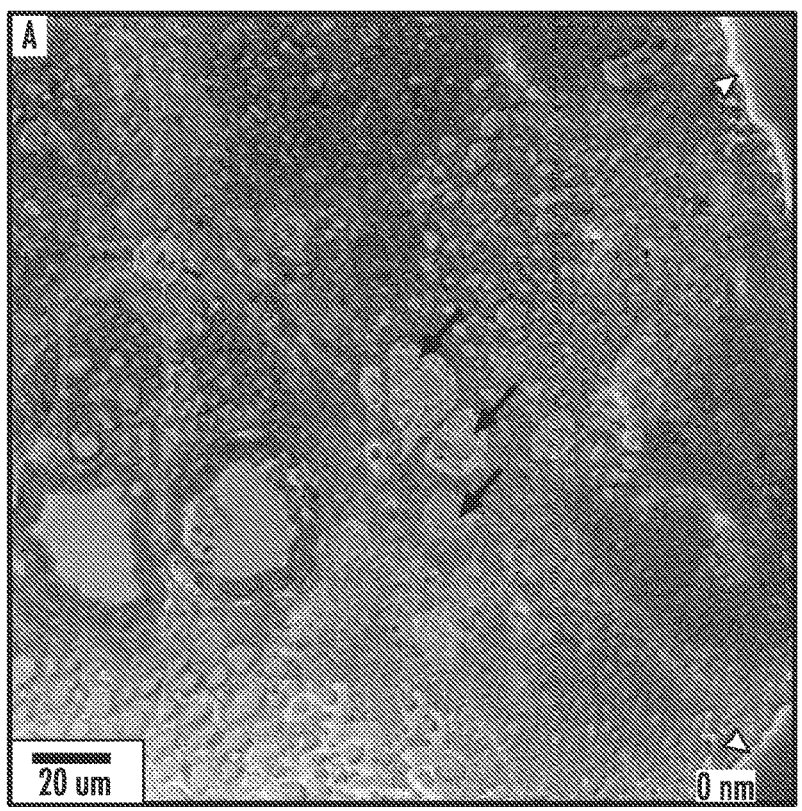
FIG. 3A shows a micrograph of an epoxy embedded spinal cord tissue not permeated with the filtered fixative/conductive freeze substitution solution.
Figure 3B:
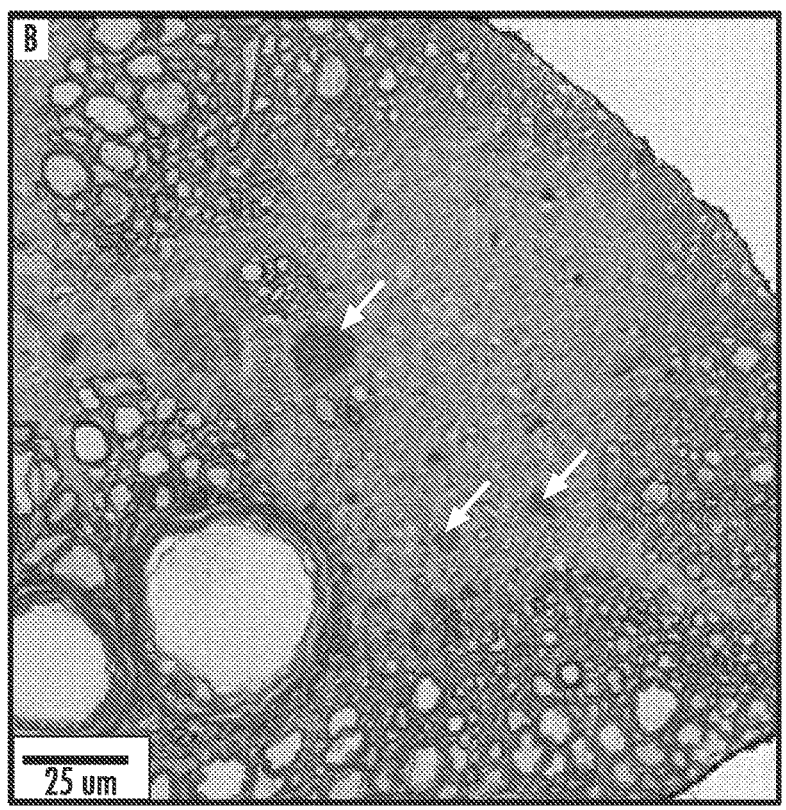
FIG. 3B shows a micrograph of an epoxy embedded spinal cord tissue permeated with the filtered fixative/conductive freeze substitution solution.

As seen in FIGS. 3A-3B, the filtered fixative/conductive freeze substitution solution including 2% osmium tetroxide/4% uranyl acetate/0.4% lead citrate/0.1% tannic acid/1% p-phenylenediamine/3% dried lanthanum nitrate/3% dried lithium trifluoromethanesulfonate diluted in absolute dried acetone permeates the spinal cord and makes it electrically conductive. FIG. 3A shows a cross-sectional view of a spinal cord not permeated with the filtered fixative/conductive freeze-substitution solution. Note the charging as demonstrated by the bright white border (shown with white arrowhead). Also, note that the image appears to be out of focus and has no contrast. The black arrows in FIG. 3A indicate spinal motor neurons retrograde labeled with a gap junction permeant, fixable, polar neural tract tracer Alexa Fluor® 594 biocytin. The charging prevents one from seeing the electron dense Alexa Fluor® 594 biocytin labeling within the spinal motor neuron soma as well as the distinct features of the nucleus and nucleolus as see in FIG. 3B (white arrows). In addition, as shown in FIG. 3B, the myelinated white matter and myelin associated with the Mauthner axons are clearly visible. Note that along the outer border of the spinal cord seen in FIG. 3B, filamentous electron dense crystalline projections can be observed emanating from the spinal cord.

Figure 4:
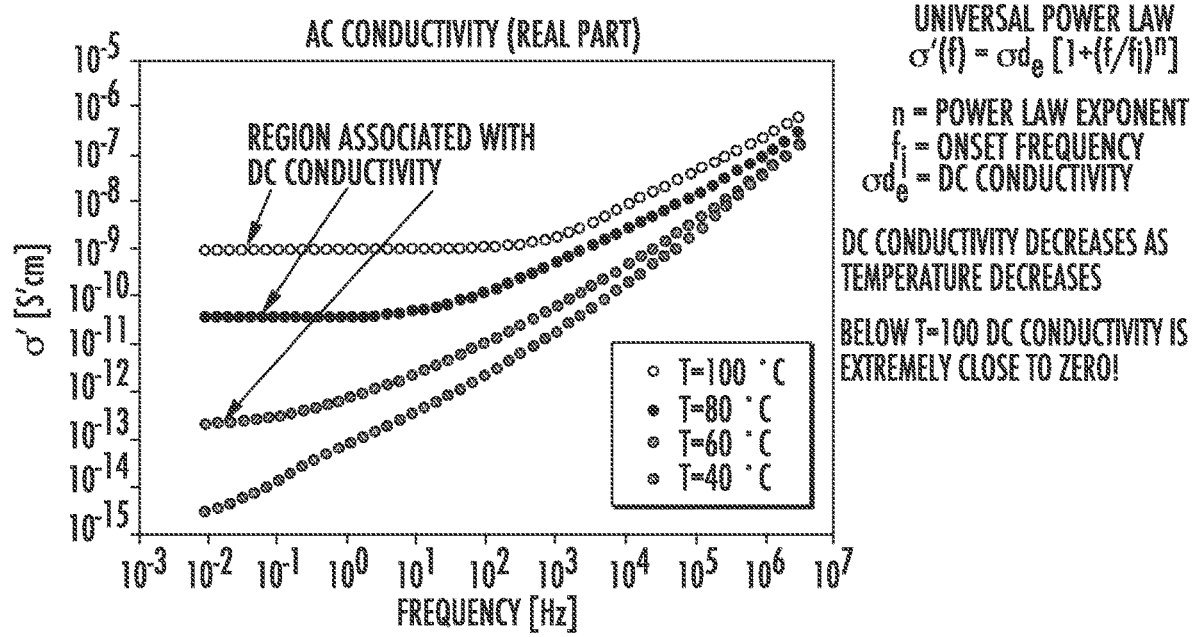
FIG. 4 illustrates broadband dielectric spectroscopy of the epoxy embedded spinal cord tissue permeated with the filtered fixative/conductive freeze substitution solution.

Broadband dielectric spectroscopy (BDS) was used to measure the dielectric properties of the epoxy embedded spinal cord tissue permeated in the filtered fixative/conductive freeze-substitution solution. As seen in FIG. 4, BDS demonstrates that the epoxy embedded spinal cord tissue permeated with the filtered fixative/conductive freeze substitution solution is electrically conductive. The electrical conductivity is correlated with lack of charging, improvement in image acquisition and image quality, and serial image registration.

Figure 5:
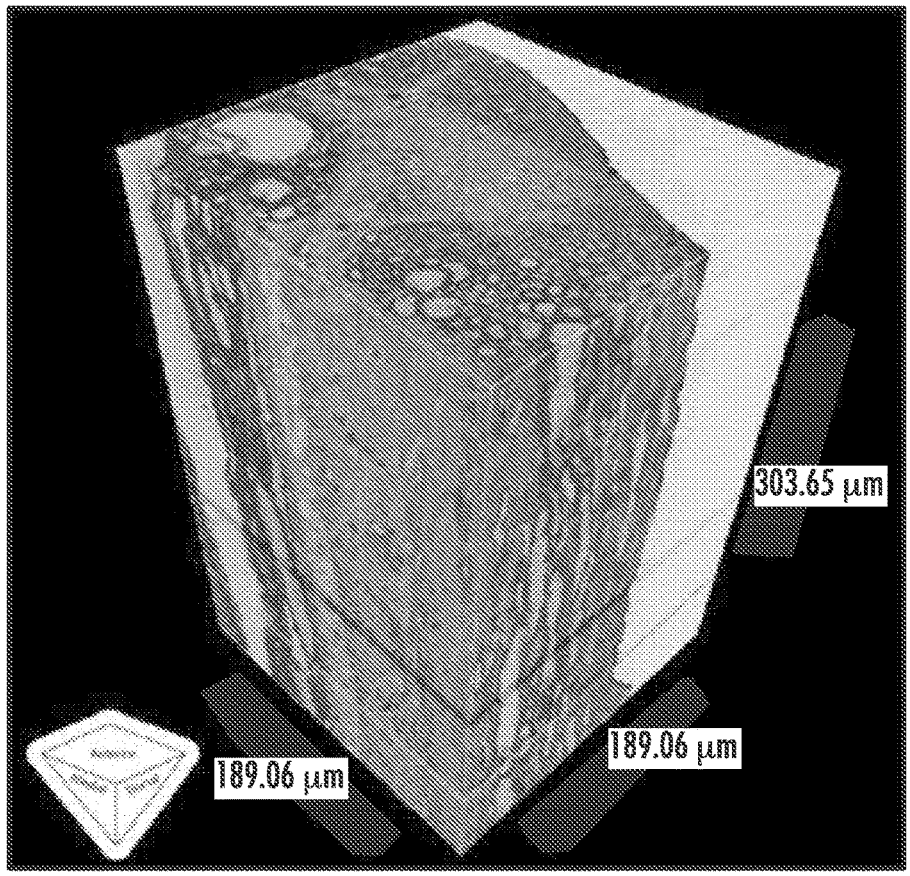
FIG. 5 shows six thousand one hundred and nine (6,109) serial images of sectioned epoxy embedded spinal cord tissue permeated with the filtered fixative/conductive freeze substitution solution at 50 nm intervals (image size: 1024× 1024; pixel size: 0.184731 μm). The 6,109 serial images are equivalent to the $14^{th}$ spinal cord ventral root of the mosquitofish (the model system used for benchmarking in Example 1).

FIG. 5 shows a data set of 6109 uninterrupted serial images at 50 nm. According to the literature, most image data sets include no more than 300 uninterrupted serial images at 50 nm.

Concentrations of dried lithium trifluoromethanesulfonate from 1% up to 5% were evaluated. These experiments suggest that 3% dried lithium trifluoromethanesulfonate concentration in the fixative/conductive freeze substitution solution provides for excellent imaging. Concentrations greater than 3% dried lithium trifluoromethanesulfonate appear to provide diminishing returns including large filamentous electron dense crystalline projections emanating from the spinal cord that at high concentrations completely surround the spinal cord. This can render some samples unusable. Other lithium salts (e.g., lithium carbonate, lithium hydroxide, and lithium chloride) were also evaluated with varying results.

Lithium trifluoromethanesulfonate makes cell and tissue samples electrically conductive and extremely stable under the electron beam. The stability of the sample when inelastically scattered electrons (energy-loss electrons, EELS), x-rays, and energy-dispersive x-ray spectroscopy (EDS) were used is extremely significant. Using lithium salts, EELS and EDS, powerful analytical electron microscopic methods, can for the first time be used to study nanoscale components of cells and tissues, thus, enabling new trajectories of study in life sciences.

Figure 6A:
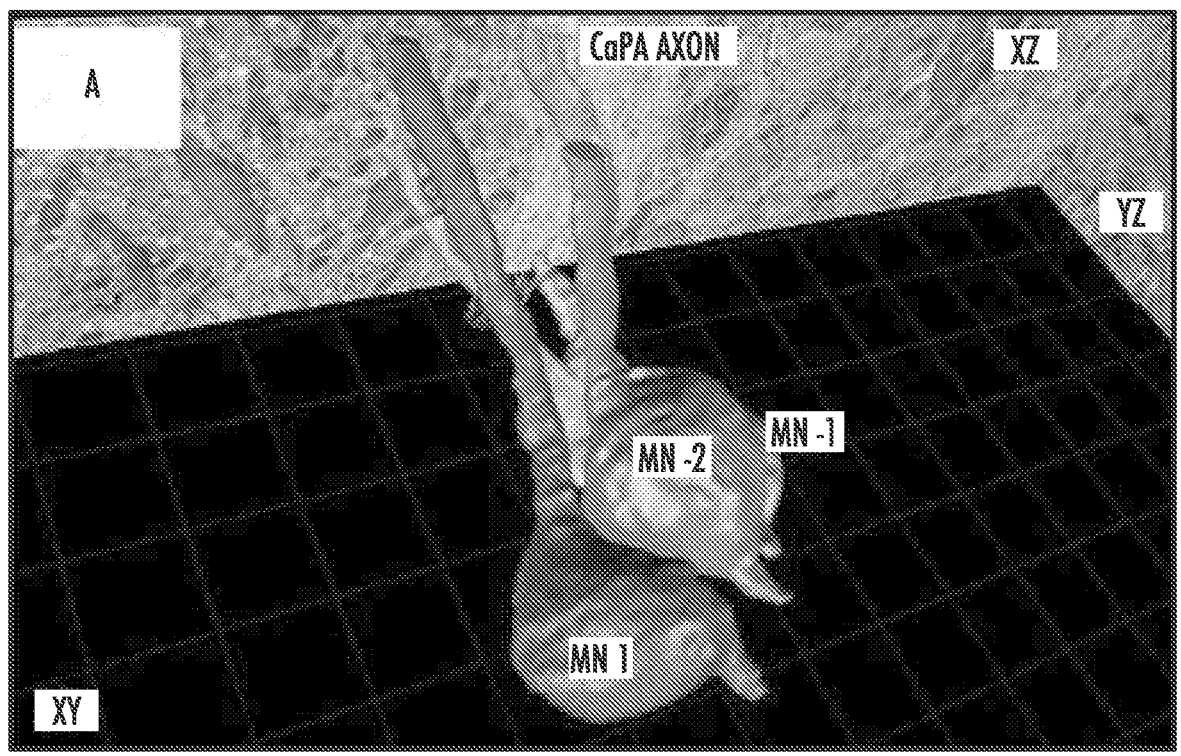
FIGS. 6A-6B illustrate that the stability resulting from the 3% dried lithium trifluoromethanesulfonate in the filtered fixative/conductive freeze substitution solution.
Figure 6B:

The osmium tetroxide, uranyl acetate, lead citrate, and dried lanthanum nitrate provide enhanced image contrast and differential en bloc staining of membranes, tight, and gap junctions. The p-phenylenediamine reduces any available osmium tetroxide that is not reduced (that is why the tissue is super black). The tannic acid and dried lithium salt (e.g., lithium trifluoromethanesulfonate) make the tissue conductive. Absolute dried acetone allows a freeze-substitution workflow at temperatures low enough to avoid the formation of ice crystals and to circumvent the damaging effects of ambient-temperature cell and tissue fixation and dehydration artifacts. This combination of chemicals and workflow for electron microscopies assists in meeting life science researchers' needs by: (1) reducing/eliminating artifacts caused by fixation, freezing, staining, and labeling; (2) improving three-dimensional image collection and image segmentation and processing (see FIG. 6); and (3) allowing researchers to fully exploit electron microscopies' capabilities to provide new trajectories.

The devices, systems, and methods of the appended claims are not limited in scope by the specific devices, systems, and methods described herein, which are intended as illustrations of a few aspects of the claims. Any devices, systems, and methods that are functionally equivalent are intended to fall within the scope of the claims. Various modifications of the devices, systems, and methods in addition to those shown and described herein are intended to fall within the scope of the appended claims. Further, while only certain representative devices, systems, and method steps disclosed herein are specifically described, other combinations of the devices, systems, and method steps also are intended to fall within the scope of the appended claims, even if not specifically recited. Thus, a combination of steps, elements, components, or constituents may be explicitly mentioned herein or less, however, other combinations of steps, elements, components, and constituents are included, even though not explicitly stated.

The term "comprising" and variations thereof as used herein is used synonymously with the term "including" and variations thereof and are open, non-limiting terms. Although the terms "comprising" and "including" have been used herein to describe various embodiments, the terms "consisting essentially of" and "consisting of" can be used in place of "comprising" and "including" to provide for more specific embodiments of the invention and are also disclosed. Other than where noted, all numbers expressing geometries, dimensions, and so forth used in the specification and claims are to be understood at the very least, and not as an attempt to limit the application of the doctrine of equivalents to the scope of the claims, to be construed in light of the number of significant digits and ordinary rounding approaches.

Unless defined otherwise, all technical and scientific terms used herein have the same meanings as commonly understood by one of skill in the art to which the disclosed invention belongs. Publications cited herein and the materials for which they are cited are specifically incorporated by reference.

What is claimed is:

1. A method of preparing a biological sample for microanalysis, the method comprising:
   (i) contacting the biological sample with a freeze substitution solution comprising a lithium salt under conditions effective to permit permeation of the lithium salt into the biological sample;
   (ii) contacting the biological sample with a first polymerizable resin under conditions effective to permit permeation of the polymerizable resin into the biological sample;
   (iii) disposing the biological sample in a volume of a second polymerizable resin; and
   (iv) heating the so-prepared biological sample to a temperature effective to cure the first polymerizable resin and the second polymerizable resin, thereby forming a 3-dimensional conductive sample block;
   wherein the lithium salt is chosen from lithium trifluoromethanesulfonate, lithium carbonate, lithium hydroxide, lithium citrate, lithium nitrate, lithium benzoate, lithium formate, and combinations thereof.

2. The method of claim 1, wherein the method further comprises contacting the biological sample with a fixation fluid prior to step (i).

3. The method of claim 2, wherein the fixation fluid comprises an aldehyde.

4. The method of claim 3, wherein the fixation fluid comprises an aqueous solution comprising from 2% to 8% by weight aldehyde, based on the total weight of the fixation fluid.

5. The method of claim 1, wherein the lithium salt exhibits a solubility in water of at least 10 g/100 mL at 20° C.

6. The method of claim 1, wherein the lithium salt comprises from 0.1% to 10% by weight of the freeze substitution solution.

7. The method of claim 1, wherein the freeze substitution solution further comprises an oxidizing fixative, and
   wherein the oxidizing fixative comprises from 0.5% to 5% by weight of the freeze substitution solution.

8. The method of claim 1, wherein the freeze substitution solution further comprises a negative stain, and
   wherein the negative stain comprises from 0.5% to 8% by weight of the freeze substitution solution.

9. The method of claim 1, wherein the freeze substitution solution further comprises a mordant,
   and wherein the mordant comprises from 0.01% to 1% by weight of the freeze substitution solution, based on the total weight of the freeze substitution solution.

10. The method of claim 1, wherein contacting step (i) comprises:
    immersing the biological sample in the freeze substitution solution at a first temperature below 0° C. for a first duration; and
    immersing the sample in the freeze substitution solution at a second temperature above 0° C. for a second duration.

11. The method of claim 10, wherein contacting step (i) further comprises immersing the biological sample in the freeze substitution solution at a third temperature below 0° C. for a third duration before immersing the sample in the freeze substitution solution at the second temperature above 0° C. for the second duration.

12. The method of claim 11, wherein contacting step (i) further comprising immersing the biological sample in the freeze substitution solution at a fourth temperature above 0° C. for a fourth duration.

13. The method of claim 10, wherein the first temperature is from −70° C. to −80° C. the second temperature is from 0° C. to 10° C., the first duration is from 8 hours to 24 hours, and the second duration is from 8 hours to 24 hours.

14. The method of claim 11, wherein the third temperature is from −10° C. to −40° C., and wherein the third duration is from 2 hours to 12 hours.

15. The method of claim 12, wherein the fourth temperature is from 15° C. to 30° C., and wherein the fourth duration is from 2 hours to 12 hours.

16. The method of claim 1, wherein the first and second polymerizable resin comprises an epoxy resin.

17. The method of claim 1, wherein the second polymerizable resin comprises an accelerator.

18. The method of claim 1, step (iv) comprises heating the so-prepared biological sample to a temperature of at least 40° C.

19. The method of claim 1, wherein the biological sample comprises a tissue sample.

20. A method of preparing a biological sample for microanalysis, the method comprising:
   (i) contacting the biological sample with a freeze substitution solution comprising a lithium salt under conditions effective to permit permeation of the lithium salt into the biological sample;
   (ii) contacting the biological sample with a first polymerizable resin under conditions effective to permit permeation of the polymerizable resin into the biological sample;
   (iii) disposing the biological sample in a volume of a second polymerizable resin; and
   (iv) heating the so-prepared biological sample to a temperature effective to cure the first polymerizable resin and the second polymerizable resin, thereby forming a 3-dimensional conductive sample block;
   wherein the lithium salt consists of lithium trifluoromethanesulfonate, lithium carbonate, lithium hydroxide, lithium citrate, lithium nitrate, lithium benzoate, lithium formate, or any combination thereof.

* * * * *